United States Patent [19]

Ellsworth et al.

[11] Patent Number: 4,753,901
[45] Date of Patent: Jun. 28, 1988

[54] TWO MASK TECHNIQUE FOR PLANARIZED TRENCH OXIDE ISOLATION OF INTEGRATED DEVICES

[75] Inventors: Daniel L. Ellsworth; Scott H. Cravens; Maurice M. Moll, all of Fort Collins, Colo.

[73] Assignee: NCR Corporation, Dayton, Ohio

[21] Appl. No.: 798,511

[22] Filed: Nov. 15, 1985

[51] Int. Cl.$^4$ .................... H01L 21/467; H01L 21/76
[52] U.S. Cl. ...................................... 437/67; 437/235; 148/DIG. 50; 148/DIG. 111; 156/649; 427/259
[58] Field of Search ............. 148/DIG. 50, DIG. 111; 156/649, 662; 437/67, 235; 427/259

[56] References Cited

U.S. PATENT DOCUMENTS

| | | | |
|---|---|---|---|
| 4,211,582 | 7/1980 | Horng et al. ......................... | 148/1.5 |
| 4,274,909 | 6/1981 | Venkataraman et al. .......... | 156/648 |
| 4,472,240 | 9/1984 | Kameyama ......................... | 156/648 |
| 4,502,914 | 3/1985 | Trumpp et al. ..................... | 156/643 |
| 4,532,696 | 8/1985 | Iwai ...................................... | 29/571 |
| 4,576,834 | 3/1986 | Sobczak ............................... | 427/93 |

FOREIGN PATENT DOCUMENTS 0091984 10/1983 European Pat. Off. .
0113343 9/1980 Japan ............................. 29/576 W

OTHER PUBLICATIONS

P. J. Tsang, "Forming Wide Trench Dielectric Isolation", *IBM Technical Disclosure Bulletin*, vol. 25, No. 11B, Apr. 1983, pp. 6129–6130.

*Primary Examiner*—Olik Chaudhuri
*Attorney, Agent, or Firm*—Wilbert Hawk, Jr.; Casimer K. Salys

[57] ABSTRACT

A two mask process for forming dielectrically filled planarized trenches of arbitrary width in a semiconductor substrate, the masks being of such character that they are amenable to computerized generation. The first mask defines the active regions and subdivides the trench isolation regions into a succession of trench and plateau regions, where the widths of the trench and plateau regions fall within in a dimensional range constrained by photolithographic precision of the masks and the ability to conformally deposit dielectric material into the trenches. With the first etch mask in place, the semiconductor is anisotropically etched to formed the first trench regions. A conformal deposition of dielectric follows, and by virtue of the dimensional constraints ensures substantially void free trench dielectric and a concluding substantially planar topology of the dielectric on the substrate surface. Following the etch of the deposited dielectric to the level of the plateau and active region surfaces, a second mask, defined to be slightly larger than the active regions, is formed over the substrate. A selective etch is then applied to remove the plateau regions and thereby form new trenches approximating in depth the first trenches. A second conformal deposition of dielectric follows, to fill the plateau region defined trenches in the manner of the first dielectric deposition. An etch of the second dielectric to the surface of the active regions follows to complete the fabrication. The substrate surface is planar and now divided into active regions which are separated by oxide filled, arbitrary width trenches.

3 Claims, 6 Drawing Sheets

MASK A

FIG. 8

MASK B

TWO MASK TECHNIQUE FOR PLANARIZED TRENCH OXIDE ISOLATION OF INTEGRATED DEVICES

BACKGROUND OF THE INVENTION

The present invention relates to the fabrication of integrated circuit semiconductor devices. More particularly, the invention as now disclosed and claimed encompasses a photolithographic mask implemented procedure for forming planarized silicon dioxide (oxide) filled trenches of arbitrary width between active regions in a semiconductor substrate.

The need for field isolation between adjacent electrically active regions together with the desire for greater planarity of wafer surfaces, which planarity provides improved photolithographic accuracy and minimizes step coverage problems, has led in recent times to the use of semi-recessed field oxides. A commonly known and still extensively used semi-recessed technique, the LOCOS process, was introduced in the the early 1970's and has until recently remained the preferred technique for isolating active regions in semiconductor wafers. However, with the increasing density of active devices on semiconductor wafers, the area penalty arising from the bird's beak or bird's head effect in the LOCOS process has become unacceptable. The volume expansion of substrate regions during thermal oxidation in accordance with the LOCOS process has made it difficult to develop refinements which improve the planar character of the wafer topology. Furthermore, with the smaller dimensions of interconnect layers, planarity of the field isolation dielectric has become even more important, from the perspective of step coverage.

To overcome the deficiencies inherent in LOCOS type semi-recessed field oxide processes, researchers have proposed various trench oxide isolation techniques. Though processes for forming planar oxide filled trenches are known for trenches of specified shapes and dimensions, techniques for forming planar trench structures of arbitrary widths have yet to evolve to a stage of flexibility suitable for routine implementation. For example, U.S. Pat. No. 4,104,086 discloses a technique for using conformal oxide to fill narrow trenches having specifically defined depths and sidewall angles. According to that teaching, conformal silicon dioxide is deposited on all exposed substrate surfaces, including the trench interior, until the thickness of the oxide causes a closure of the trench cavity.

In an attempt to deal with trenches having varying depths and sidewall angles, the inventors in U.S. Pat. No. 4,139,442 proposed a different trench isolation technique, according to which adjacent narrow trenches of fixed relationship are simultaneously formed in all trench regions. The silicon projections between adjacent trenches are thereafter converted to silicon dioxide by conventional oxidation techniques and then, if necessary, further filled with deposited oxide. However, the oxidation process remains subject to the variables of the volume expansion.

Another technique, involving the creation of thin silicon walls between adjacent and simultaneously formed trenches, appears in U.S. Pat. No. 4,211,582. Unfortunately, the proposed approach also requires the careful use of significant oxidation, and concludes with a nonplanar surface topology. Although trenches of arbitrary width can be created and filled with a dielectric using the technique, the complexity and above noted deficiencies are clear detractors.

Another trench isolation process is disclosed in U.S. Pat. No. 4,238,278. There, conformally deposited polysilicon is used to fill the trench voids and, after planarization of the surface, is oxidized to establish continuity of the dielectric across the mouth of each trench region. Wider trenches are formed with a second etch of the substrate and an oxidation of the substrate silicon in the area of the second etch. However, exact implementation of the latter technique is somewhat speculative in that there are exposed regions of polysilicon, silicon dioxide, and monocrystalline silicon which must be selectively masked and etched to implement the procedure, while the specific teaching thereof is conspicuously omitted. The process disclosed in U.S. Pat. No. 4,238,278 is also deficient by virtue of the residual polysilicon it inherently retains, as depicted in FIG. 4 thereof. Experience has shown that such residuals may act as long term charge trapping sites, in the sense of nonvolatile floating gate devices. Furthermore, such polysilicon residuals increase the capacitive coupling for interconnect lines passing in close proximity thereto.

Given the complexities and deficiencies of the various procedures set forth in the references noted hereinbefore, the most commonly practiced techniques for creating trench isolation structures filled with oxides utilize spin-on coatings. According to the common feature of such techniques, the uneven surface following oxide deposition in trenches of arbitrary width is first covered by a moderate viscosity spin-on coating and is then reactive ion etched in an environment providing a 1:1 etch ratio of the coating to the underlying oxide dielectric. Thereby, at least conceptually, the planar nature of the surface is transferred to the dielectric layer. Unfortunately, with arbitrary width trenches the spin-on coating must be of sufficiently low viscosity to flow into minimum width trenches while retaining the planarity desired in the face of surface tension forces in wide trench areas. These characteristics are difficult to achieve over an entire wafer if the tolerances required for submicron devices are to be obtained consistently. A recent variation to the use of spin-on coating is disclosed in U.S. Pat. No. 4,505,025. This refined technique remains subject to the effects of non-unity etch ratios as well as the effects of mask misalignments.

Therefore, there remains a need for a trench oxide isolation process which avoids the stress problems of thermal oxidation, insures the absence of conductive residue within the trench region, and provides a planar active region surface, yet is implemented without undue design or fabrication complexity.

BRIEF SUMMARY

The present invention overcomes the problems noted above by merging the use of dimensionally refined photolithographic masking patterns and multiple anisotropic and selective etching operations with conformal depositions of dielectric to form planar wafer surfaces having trenches of arbitrary widths. The generation of the mask pattern by which the invention can be practiced is readily accomplished by software routines used in conjunction with computer aided design equipment of conventional nature. The detrimental effects of thermal oxidation and the variables associated with the use of spin-on coatings are avoided. In addition, the mask alignment tolerances and the dimensional control requirements of the photolithographic masks are minimized.

According to one practice of the invention, a first mask is generated by dimensionally evaluating the trench regions to identify those areas having a span greater than a multiple of a definable dimension called lambda. Lambda is related generally to the minimum lithographic dimension which can be transferred to the substrate material by available procedures. Whenever the span of a trench region exceeds approximately three lambda, the first mask is modified to insert plateau regions, and additional trenches if necessary, to further subdivide the wider trench region. The final objective is to establish a first mask pattern in which all trench widths are constrained to be less than 3 lambda in dimension. A second mask is also generated to implement the process, the patterns in this mask defining areas slightly larger than each of the substrate active regions.

During the fabrication of the trench regions the first mask is used to photolithographically form an etch masking layer of photoresist over the prescribed active regions and supplementally generated plateau regions. An anisotropic etch follows to form trenches of constrained width, related to lambda, between the active regions, where such trenches are further interlaced by plateau regions in those areas where the final trench widths would otherwise exceed the lambda related limitations. Thereafter, silicon dioxide is conformally deposited by known techniques to first completely fill and pinch off the dimensionally controlled trench regions and then form a substantially planar surface topology. An oxide etch follows, to expose the substrate in the active regions and supplemental plateau regions while retaining a planar wafer surface topology.

The second of the mask patterns is then used to create a photoresist etch masking layer over the initially defined active regions while exposing the monocrystalline silicon substrate in the supplemental plateau regions. A selective etch of the substrate silicon, to approximately the depth of the earlier formed trenches, follows to remove the supplemental plateau regions. The plateau regions so removed are then filled during a second conformal deposition of silicon dioxide, which like the first deposition is formed so as to pinch off within the etched cavity and deposit with substantial planarity thereafter. The process is concluded with an oxide etch back to the level of the active region substrate surface.

Alternate embodiments of the invention can include a brief thermal oxidation before the deposition of the first oxide, the formation of the ubiquitous wells by implantation prior to the deposition of the first oxide, and the utilization, where desired, of the spin-on planarization techniques.

The process is particularly flexible and cost efficient to implement in that the trench region plateau pattern for the first etch mask as well as the dimensionally adjusted active region pattern of the second etch mask can be generated by software routines employing workstations commonly used in the design of integrated circuit mask patterns.

DETAILED DESCRIPTION

Figure 1:
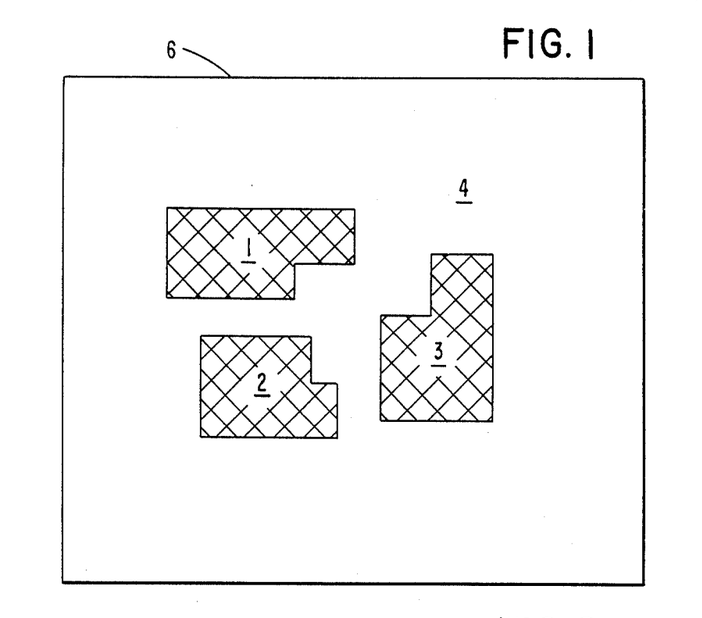
FIG. 1 depicts a set of active regions of differing patterns within a defined area of a substrate.

Attention is now directed to FIG. 1 of the drawings, where there is shown a portion of a substrate surface, including active regions 1, 2 and 3 separated by arbitrary width trench isolation regions 4 situated within a defined boundary 6. Preferably, the patterns represent active regions which upon the conclusion of wafer fabrication will contain integrated circuit devices, such as field effect or bipolar transistors, which are electrically isolated from one another by trench region 4.

According to the invention, the mask pattern used to create the active and trench isolation regions involves, in one aspect, the creation of two, complementary photolithographic fabrication mask patterns which have uniquely defined pattern characteristics, yet can be generated in relatively automated fashion using available design tools.

The description will first focus on the generation of the mask patterns by which the process can be exercised, and will conclude with the development of a preferred fabrication process.

Figure 2:
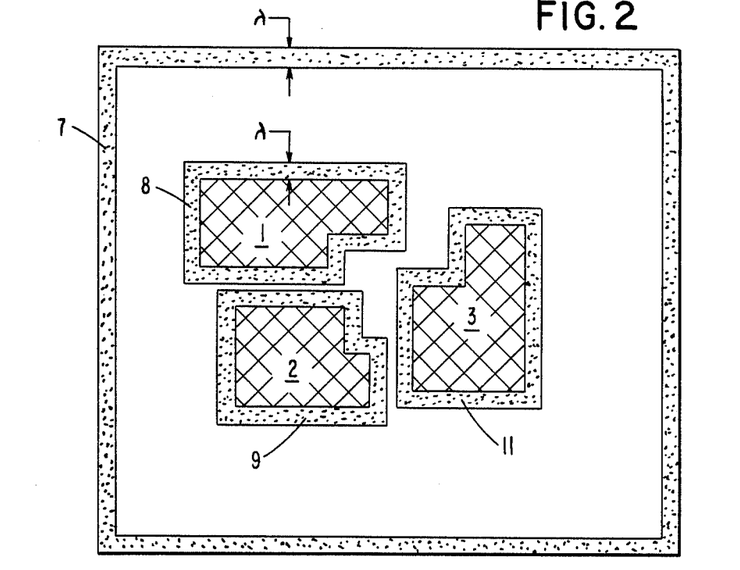
FIGS. 2-7 show the interative effects of an algorithm which subdivides the arbitrary size trench regions into trenches and plateaus of prescribed dimensions.

Beginning with the active region patterns depicted in FIG. 1, the preferred procedure for generating the first mask, hereafter identified as Mask A, begins with the manual or automatic definition of first trench regions 7, 8, 9 and 11, to individually surround active regions 1, 2 and 3 and to project inwardly from boundary 6. Each trench region is initially defined to be approximately 1 lambda in width, as generally shown in FIG. 2. Conceptually, the operation in FIG. 2 represents the first iteration in a subdivision of the trench isolation region 4 by moving inward from boundary 6 and outward from the boundary of each active region 1, 2 and 3, so that supplemental boundary regions, hereafter generally referred to as plateaus, are generated whenever the spacing between boundaries is 2 lambda or greater.

While lambda is determined by the minimum lithographic dimension, as will be apparent at a later point, lambda is somewhat constrained by the thickness to which a dielectric, preferably silicon dioxide, can be conformally deposited without creating voids or stress fractures when 1 to 3 lambda width trench regions are filled in and pinched off. Exemplary variables which affect the filling of such trench regions with silicon dioxide are described in U.S. Pat. No. 4,104,086. With reference to such teaching, it should be understood that lambda is subject to diverse variation. The embodiment set forth hereinafter utilizes a single arbitrarily selected value for lambda to simplify the illustration of the underlying concepts.

Figure 3:
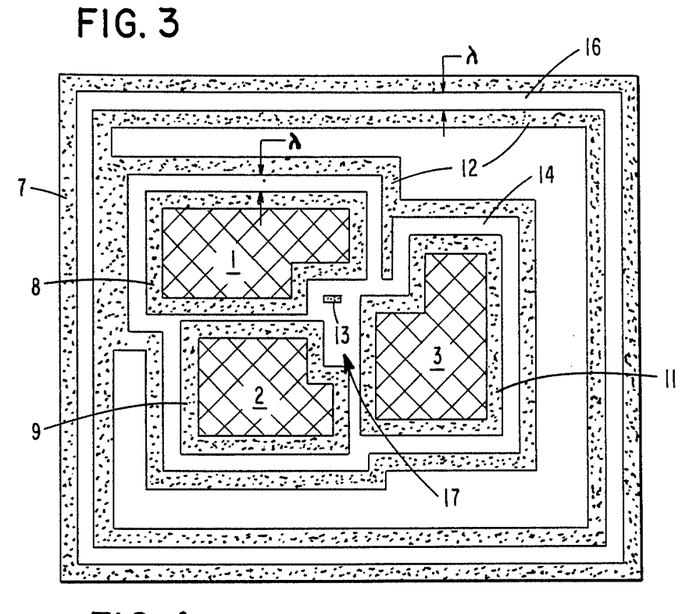

The next iteration in the generation of the pattern for Mask A is depicted in FIG. 3 of the drawings. In this figure there is shown the addition of trench regions 12 and 13, which again are lambda or less in width. However, these trenches are separated from previously defined trench regions 7, 8, 9 and 11 by plateau regions 14 and 16, which plateau regions are also 1 lambda in width. Note, however, that the plateau region at location 17, immediately below region 13, has not been further subdivided, by virtue of the fact that the spacing between trench patterns 9 and 11 is less than 2 lambda at location 17.

Figure 4:
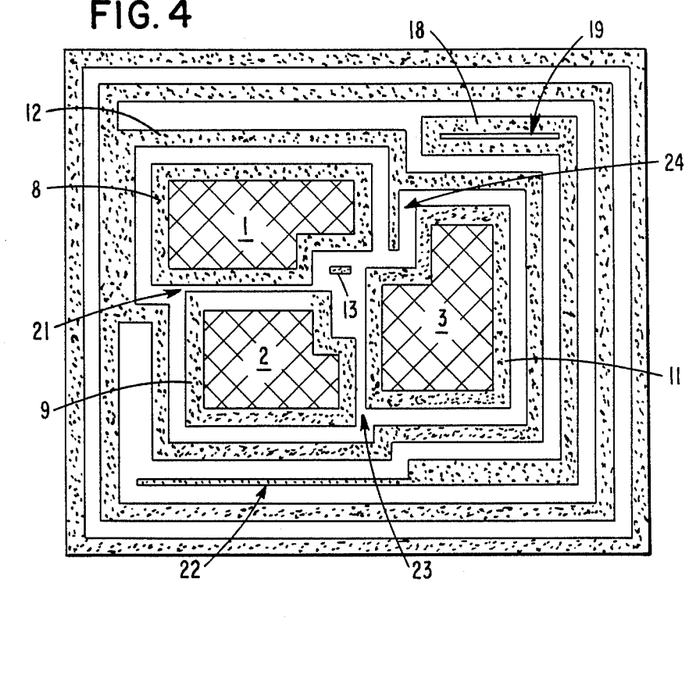

The succeeding iteration in the generation of Mask A is depicted in FIG. 4 of the drawings, where those regions of formerly defined trench isolation region 4 which have not as of this time been fully subdivided are further subject to subdivision by the formation of lambda width trenches wherever the spacing between previous trenches is 2 lambda or greater. Following this rule, the pattern depicted in FIG. 4 now includes trench region 18 of 1 lambda or less width. With the generation of the pattern depicted in FIG. 4 further subdivision will cease, in that no region remaining has a span of 2 lambda or greater.

An examination of the pattern depicted in FIG. 4 discloses that a number of trench and plateau regions defined during the preceding iterative operations are less than 1 lambda in width. For example, the plateaus at locations 19, 21 and 23 as well as the trenches at locations 12, 22 and 24. Recall that the fabrication process by which silicon dioxide is to be deposited provides a substantially planar topology only when the width of the trenches being filled is less than 3 lambda, and that only those regions greater than or equal to 1 lambda can be defined lithographically. Consequently, further refinement of the pattern depicted in FIG. 4 is necessary to compensate for the narrow trench and plateau regions. The reason the plateau regions are subject to the same lambda constraint will be apparent upon understanding the fabrication process, to be described hereinafter.

Figure 5:
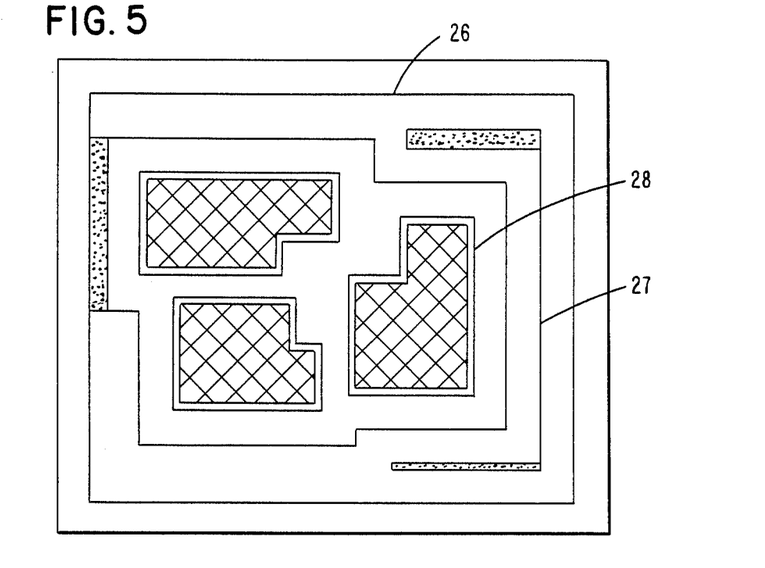
Figure 6:
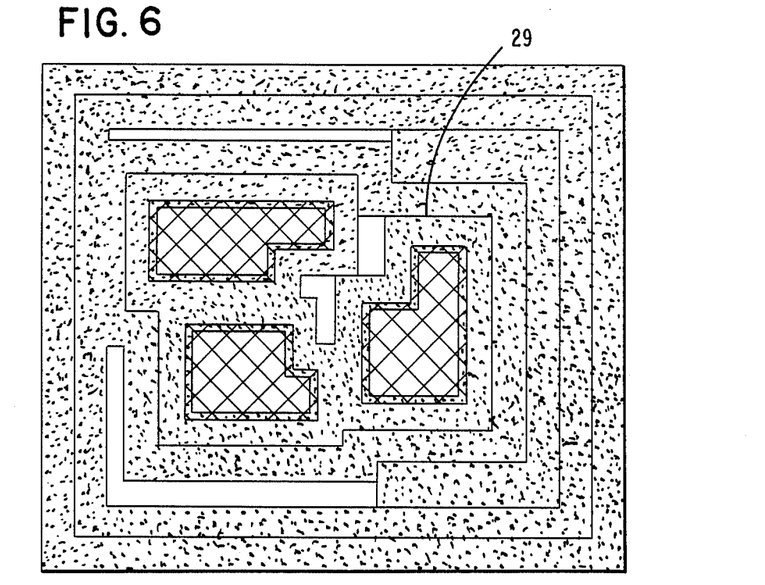

The unacceptably narrow trench and isolation regions at locations 13, 19, 21, 22 and 23 are removed by subjecting the pattern to a sequential algorithm, the end product of which is a pattern having trench and plateau regions with all widths between 1 and 3 lambda. The pattern refining technique that leads to a mask pattern having the specified constraints begins with a shrink of all trench region boundaries by an amount equal to 0.49 lambda, and the deletion of any region which shrinks to a zero dimension. The effect of this operation is to remove trench regions narrower than 1 lambda. Directing attention to FIG. 5, the effects of this operation are depicted at locations such 26, 27 and 28, where most trench regions appear as no more than lines in the figure. The next operation is directed toward deleting plateaus which were in FIG. 4 narrower than 1 lambda. To accomplish this, the borders of the trenches are oversized by 0.98 lambda per side and the plateaus which shrink to zero are deleted. The effects of this operation appear in FIG. 6, where most plateau regions are now no more than lines, e.g. 29. The sequence of operations is concluded with another reduction in the trench pattern by 0.49 lambda per side.

Figure 7:
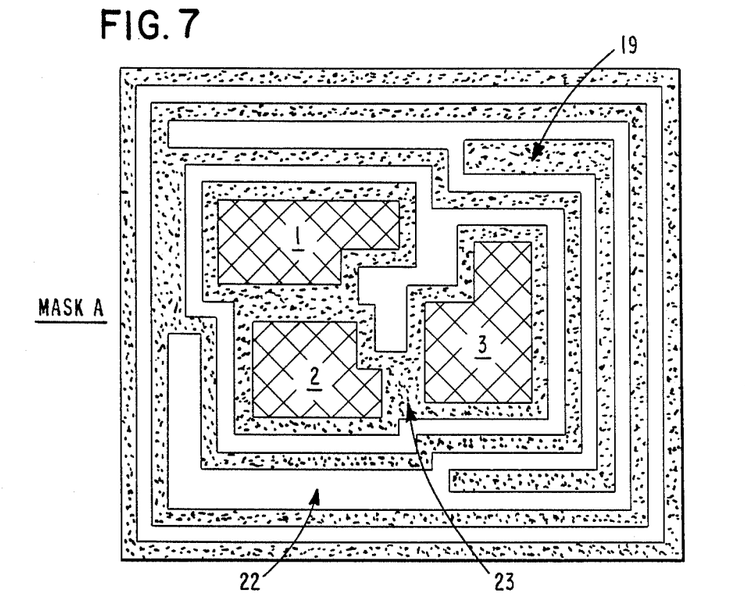

The final pattern for Mask A is depicted in FIG. 7. In comparison to the pattern in FIG. 4, the pattern in FIG. 7 shows that trench regions formerly narrower than 1 lambda, such as that previously located at 22, as well as plateau regions formerly narrower than 1 lambda, such as those previously at locations 19 and 23, have been removed without violating the dimensional constraint that trench and plateau regions will be between 1 and 3 lambda in width.

Figure 8:
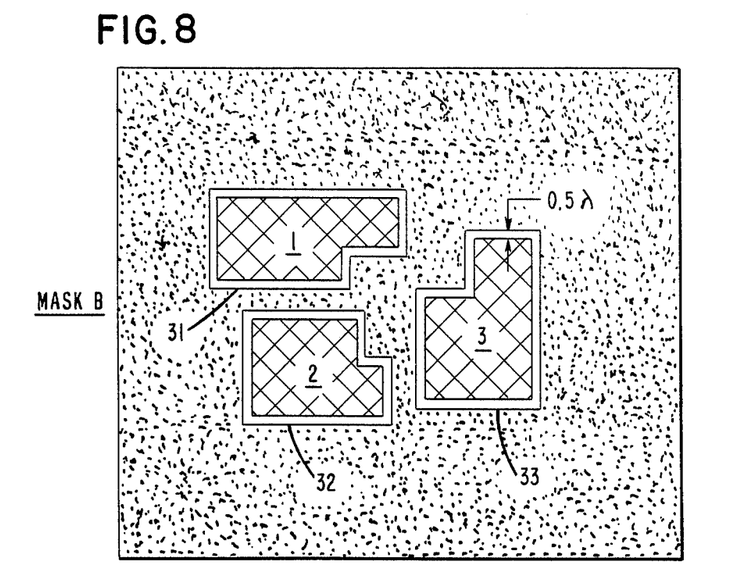
FIG. 8 shows the mask complement to the mask depicted in FIG. 7, which two masks are used to implement the fabrication process of the present invention.

The complement to Mask A is Mask B, which is shown schematically in FIG. 8 of the drawings to be comprised of a pattern ½ lambda wider than the formerly defined active regions 1, 2 and 3, and as such is defined by respective perimeters 31, 32 and 33. The process by which the pair of masks is utilized to fabricate trench isolation regions will be fully developed in the ensuing description of the fabrication process.

An important feature of the invention, and particularly as it relates to the formation of Mask A, is the ease with which the generation of the trench and plateau patterns of the mask can be automated. One practice of this automation feature is exemplified by the software program set forth in Table A, written in common Mask Analysis Language of the CALMA (a trademark of the General Electric Company) layout system.

TABLE A

MASK ANALYSIS FILE FOR TRENCH ISOLATION
PROCESS MASK GENERATION

```
| INPUT THE ACTIVE LAYERS

INPUTMASK(ACTIVE,2 3,0–63)

| INPUT THE BOUNDARY LAYER SURROUNDING THE
| CHIP
INPUTMASK(BOUND,63,0–63)

| DEFINED INTERMEDIATE TRENCH POLYGONS
| (LAMBDA = 1 MICRONS HERE)

INVERSE:=BOUND MINUS ACTIVE
INT1:=UNDERSIZE(1,INVERSE)
M0:=INVERSE MINUS INT1

INT2:=UNDERSIZE(1,INT1)
INT3:=UNDERSIZE(1,INT2)
M1:=INT2 MINUS INT3

INT4:=UNDERSIZE(1,INT3)
INT5:=UNDERSIZE(1,INT4)
M2:=INT4 MINUS INT5

INT6:=UNDERSIZE(1,INT5)
INT7:=UNDERSIZE(1,INT6)
M3:=INT6 MINUS INT7

.
.

INTn:=UNDERSIZE(1,INTn−1)
INTn+1:=UNDERSIZE(1,INTn)
Mi:=INTn MINUS INTn+1

| REPEAT UNTIL NO DATA GENERATED BY
| UNDERSIZE
| OR ALL INTERMEDIATE TRENCH POLYGONS
| TOGETHER
O0:=M0 OR M1
O1:=O0 OR M2
O2:=O1 OR M3
O3:=O2 OR M4

.
.

Oi:=Oi−1 OR Mi+1

| SIZE TO GET RID OF POLYGONS LESS THAN
| LAMBDA IN WIDTH AND TO COMBINE POLYGONS
| CLOSER TOGETHER THAN LAMBDA
TEMPA:=UNDERSIZE(.49,Oi)
TEMPA2:=OVERSIZE(.98,010)
MASKA:=UNDERSIZE(.49,011)
MASKA2:=ACTIVE OR MASKA

| OUTPUT THE "A" MASK

OUTPUTMASK(MASKA2,3 0)

| CREATE THE "B" MASK BY OVERSIZING THE
| ACTIVE MASK AND SIZING TO GET RID OF
| UNWANTED GEOMETRIES
TEMPB:=OVERSIZE(.5,ACTIVE)
TEMPB2:=UNDERSIZE(.49,TEMPB)
TEMPB3:=OVERSIZE(.98,TEMPB2)
```

TABLE A-continued

MASK ANALYSIS FILE FOR TRENCH ISOLATION
PROCESS MASK GENERATION

MASKB:=UNDERSIZE(.49,TEMPB3)

| OUTPUT THE "B" MASK

OUTPUTMASK (MASKB,4 0)

Copyright NCR Corporation 1985

Note that the algorithm involves a subtraction of the active region from the boundary of the established chip area, sequential undersizings by lambda followed by subtractions from the previous boundaries, a multiplicity of logical "OR" operations, and a concluding sequence of undersizing and oversizing to generate Mask A. The generation of Mask B basically involves an oversizing of the active area, but does undergo an oversizing and undersizing sequence to ensure dimensional correspondence with Mask A.

With the set of fabrication masks at hand, attention will now be directed to the process by which such masks are employed to fabricate trench oxide isolation regions of arbitrary width in substrates, where the trench isolation dielectric is preferably silicon dioxide and the substrate material is preferably monocrystalline silicon. Nevertheless, it should be understood that such materials and associated dimensional relationships are merely exemplary. Foremost, it should be appreciated that the composite invention becomes particularly valuable when it includes the combination of automated mask pattern generation with the fabrication sequence described hereinafter.

It should be understood that the mask patterns used in depicting the various steps in the fabrication process as set forth in FIGS. 9-15 do not correspond to the patterns in Masks A or B, FIGS. 7 and 8, but are selected to depict the central concepts of the fabrication process.

Figure 9:
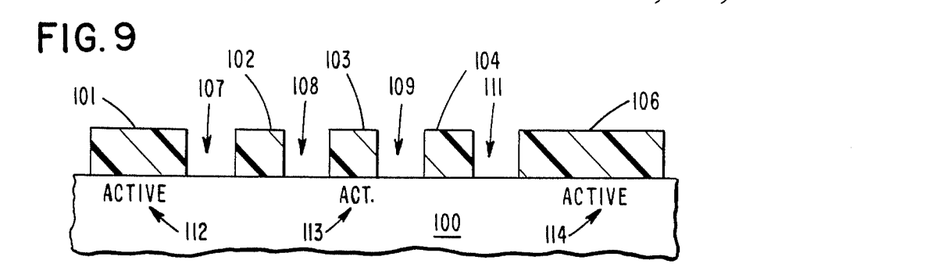
FIGS. 9-15 are cross sectional representations of the effects on the substrate produced in the practice of the fabrication process.

The cross section shown in FIG. 9 includes a monocrystalline silicon substrate 100, which has formed thereupon an etchant mask of photoresist formerly subjected to photolithographic processing to retain photoresist regions 101, 102, 103, 104 and 106 while exposing the substrate at locations 107, 108, 109 and 111. For purposes of this example, locations 112, 113 and 114 are defined to be the active regions, functionally corresponding to regions 1, 2 and 3 in FIG. 1. The width dimensions of photoresist regions 102 and 104 as well as the openings at 107, 108, 109 and 111 are prescribed to be approximately 1 lambda.

Figure 10:
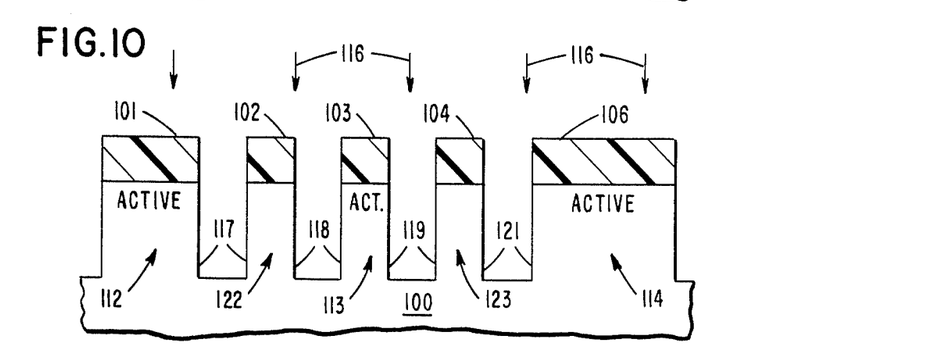

Upon applying the anisotropic etch 116 as depicted in FIG. 10 to substrate 100, trenches 117, 118, 119 and 121 of approximately 1 lambda width are formed into substrate 100. Monocrystalline silicon active regions 112, 113 and 114 are now separated by both trenches and supplemental plateau regions 122 and 123. Where substrate 100 is composed of monocrystalline silicon and lambda is 1 micrometer, anisotropic etch 116 is preferably performed with nitrogen triflouride or a sulfur hexafloride/freon mixture, and is continued until trenches 117, 118, 119 and 121 are approximately 1-4 micrometers deep. Recall that the depth and sidewide angles of the trenches are constrained by the ability to conformally deposit the silicon dioxide dielectric without voids in the succeeding steps of fabrication. Reference is again made to the teachings in U.S. Pat. No. 4,104,086 for guidance. Upon the conclusion of etching, photomask segments 101, 102, 103, 104 and 106 are stripped in preparation for the deposition of the dielectric material.

Figure 11:
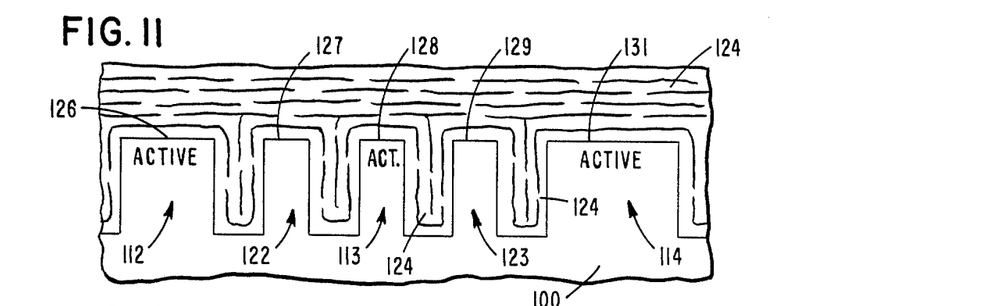

The conformal deposition of dielectric follows, preferably applying the concepts described in U.S. patent No. 4,104,086 and the information set forth in the article by Levin et. al., entitled "The Step Coverage of Undoped and Phosphorus Doped $SiO_2$ Glass Films", which appeared in the Journal of Vacuum Science and Technology, Vol. B1(1), 1983, page 54. Upon the conclusion of the conformal dielectric deposition, trenches 117, 118, 119 and 121 are filled with silicon dioxide 124 as shown in FIG. 11, the deposition being continued until the surface topology of the deposited dielectric is substantially planar and absent of voids in the trench recesses. Where lambda is for illustration purposes set at a value of approximately 1 micrometer, and the trench is designed to have a depth of approximately 2 micrometers, the conformal deposition of dielectric preferably involves an LPCVD process using TEOS (tetraethylorthosilicon) and a deposition temperature of approximately 700 degrees C. Deposition is continued until the surface layer thickness of silicon dioxide 124 is somewhat greater than 1.5 micrometers.

To more fully appreciate the desired relationship between the width of the trenches and the thickness of the conformally deposited silicon dioxide, recall that the first mask pattern, Mask A in FIG. 7, is by design prescribed to have a width ranging between 1 and 3 lambda, herein corresponding to 1-3 micrometers. Consequently, the thickness of the conformally deposited silicon dioxide dielectric must be at least 1.5 lambda to insure trench closure, and should further include an additional margin for process variations. Preferably, the dielectric deposition would thereafter be continued for a slightly longer period to insure a more planar surface topology.

Following the deposition of silicon dioxide 124, as appears in FIG. 11, substrate 100 is subjected to an etching operation to expose surfaces 126, 127, 128, 129 and 131 of monocrystalline silicon substrate 100. Reasonable care must be exercised to ensure that the etching operation is curtailed soon after reaching the monocrystalline silicon surface. Otherwise, degradation of active region surfaces may result. The etching process may be either isotropic or anisotropic. Preferably the etchant is selective, removing silicon dioxide dielectric at a materially greater rate than monocrystalline silicon. The specifics of such processes are well known by those who routinely practice in the art.

Figure 12:
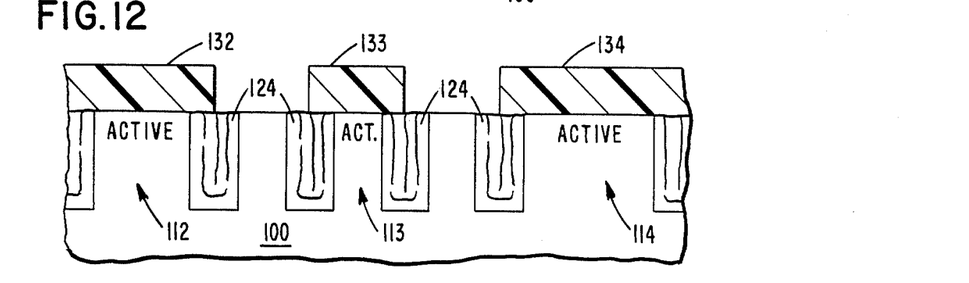

The substantially planar surface formed by the etching operation is then photolithographically processed to create a second etchant mask, this mask having a pattern corresponding functionally to Mask B in FIG. 8. Recall that the Mask B pattern is generally the active region oversized by approximately $\frac{1}{2}$ lambda. As shown in FIG. 12, the formation of such a mask pattern places photoresist segments 132, 133 and 134 over respective active regions 112, 113 and 114, with slight, approximately $\frac{1}{2}$ micron, overlaps onto previous deposits of trench oxide 124. It should be appreciated that this overlap relaxes the the alignment tolerance for the photolithographic process associated with the use of Mask B. The precision and ease of alignment for Mask B also benefits from the highly planar surface topology being processed at this stage in a fabrication cycle.

Figure 13:
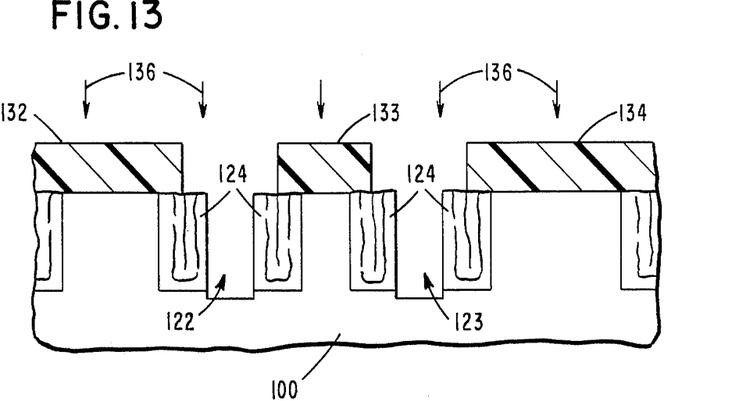

Substrate 100, with Mask B patterned photoresist segments 132, 133 and 134, is then subjected to a selective etch operation, such as etch 136 depicted in FIG.

13, to remove monocrystalline silicon in the now exposed plateau regions 122 and 123 until the depth is approximately equal to the previously etched, and now silicon dioxide 124 filled, trenches. Representative selective etching operations for a monocrystalline silicon substrate and silicon dioxide filled dielectric trenches would consist of either a dry etch involving nitrogen tri-fluoride plasma or, alternatively, a plasma having a mixture of sulfur hexaflouride and freon 12. As is suggested in FIG. 13, though the depth to which selective etch 136 removes substrate 100 is not critical, it should avoid a material undercut of oxide 124. Following the etch of monocrystalline silicon 100, masking photoresist regions 132, 133 and 134 are stripped in conventional manner.

Figure 14:
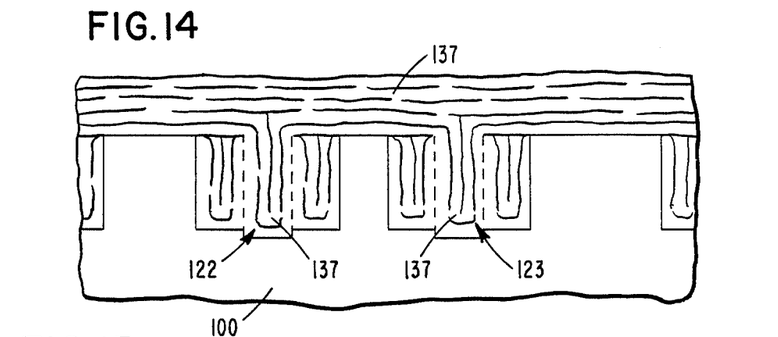
Figure 15:
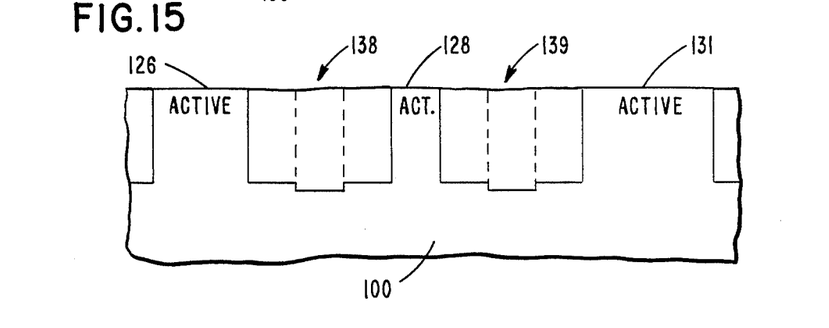

Fabrication of the oxide filled trenches is continued as shown in FIG. 14 by a second conformal deposition of dielectric 137 utilizing, for example, the previously described general LPCVD of silicon dioxide guidelines. Again, deposition is continued until the trenches at 122 and 123, previously plateaus of silicon, are completely filled with dielectric and the surface of the substrate approaches a substantially planar topology. The repeated application of the formerly utilized oxide deposition process is attributable to the dimensional symmetry imposed upon the trench and plateau regions during the formation of Mask A, in that those regions formerly defined as plateaus now become trenches. Consequently, the widths of trenches 122 and 123 are constrained to range between 1 and 3 lambda.

Following the formation of the substantially planar surface topology, the substrate is again subjected to either an isotropic or anisotropic etch until the active region surfaces at 126, 128 and 131 are exposed. See FIG. 15. At this point, the wafer is in a suitable form for further processing to form in such regions various active semiconductor devices isolated respectively by dielectric filled trenches 138 and 139.

On occasion it is desirable to have a high quality thermal oxide, or other dielectric material, or an impurity zone, at the trench interface between the deposited dielectric and the semiconductor substrate, for example to minimize interface state density. The present process is suitable for the practice of such alternate embodiments. For example, composite trenches 138 and 139 in FIG. 15 can be lined with a thin layer of thermally grown silicon dioxide by subjecting the substrate to a brief thermal oxidation at a fabrication stage between anisotropic etch 116, in FIG. 10, and the conformal deposition of dielectric 124, in FIG. 11. Note that the generation of Mask A in FIG. 7, includes as a first step, in FIG. 1, the definition of trenches which establish a perimeter around each active region and, as such, ensure that any such alternate thermal oxidation operation acts in a continuum around each active region.

According to another embodiment, the walls of the trenches formed by anisotropic etch 116, FIG. 10, can be doped in conjunction with or independent of the previously noted thermal oxidation to minimize charge leakage paths along the trench surface. The use of LPCVD depositions, as depicted in FIGS. 11 and 14, to fill the trench regions with dielectric avoids by virtue of the low temperatures detrimental redistributions of any such wall dopants.

In another aspect, the process is also suitable for use in the fabrication of ubiquitous wells in CMOS type devices. According to that practice, following the anisotropic etch 116 in FIG. 10 substrate 100 is subjected to doping, implemented either by a blanket implant or by a selective photoresist mask implant operation. During such implant, the relatively narrow plateau regions 122 and 123 in FIG. 10 are subjected to sidewall doping, which sidewall dopant diffuses across the plateaus of monocrystalline silicon during the well drive anneal cycle. Note that the same effect holds for narrow active regions, such as 113 in FIG. 10. In the implementation of such a procedure care must be exercised to ensure that the depth of the anneal cycle diffusion is measurably greater than ½ lambda. This provides a suitable interwell resistivity for ubiquitous well regions. Clearly, as the depths of trenches 117, 118, 119 and 121 increase, the likelihood of implant scattering into the walls increases, with a concomitance decrease in the amount of impurity reaching the bottom of the well. With the plateau regions being subject to subsequent removal, it is apparent that care must be exercised to ensure that the dopant reaching the bottom of the wells is adequate upon lateral diffusion to interconnect any ubiquitous well regions having deep trench structures.

The present process as set forth in the various embodiments hereinbefore is also suitable for merger with presently practiced spin-on planarization techniques. According to such a practice, the deposition of the silicon dioxide dielectric, such as 124 in FIG. 11 or 137 in FIG. 14, would be followed by a spin-on deposition of a planarizing polymer. Thereafter, the polymer coating and upper, presumably somewhat nonplanar portion of the dielectric layer would be removed with an etchant having a 1:1 polymer-to-dielectric etch ratio.

It should be understood and appreciated that although the invention has been described in the context of using a monocrystalline silicon substrate and silicon dioxide as the trench dielectric, the fundamental aspects of the invention are not so circumscribed. It should be clear from the alternate embodiments described herein that the fundamental features of the invention are suitable for broad application to diverse semiconductor materials employing further diverse dielectrics. In all cases the invention features a trench isolation fabrication process which can be practiced without thermal oxidation, thereby avoiding adverse dopant redistributions and the associated volumetric change induced stresses, the use of but two masking levels, in which the second mask is very tolerant of misalignments and dimensional variations, the formation of the mask patterns on consistently planar surfaces, the absence of dielectrically isolated semiconductor residuals, so as to avoid charge trapping sites and parasitic capacitance sources, a highly automated mask generation technique, and the flexibility of allowing for selective oxidation, doping or deposition to inhibit leakage currents or to define ubiquitous wells.

We claim:

1. A process for creating patterns suitable for forming dielectrically filled trenches of arbitrary width between active regions in a semiconductor substrate, comprising the steps of:

defining for the semiconductor substrate an outer boundary encompassing at least one active region;

using a fixed dimension, generically identified as lambda, to define a first polygon trench region approximately lambda wide inward of the outer boundary and a second polygon trench region approximately lambda wide outward of the active region;

defining polygon plateau regions not exceeding approximately lambda in width at locations correspondingly inward and outward of the polygon trench regions, wherever the boundaries of the inward and outward polygon trench regions are separated by approximately two lambda or greater;

defining polygon trench regions not exceeding approximately lambda in width at locations correspondingly inward and outward of the polygon plateau regions, wherever the boundaries of the inward and outward polygon plateau regions are separated by approxmiately two lambda or greater;

repeating in succession the preceding two steps until the remaining regions are all separated by less than two lambda;

shrinking the boundaries of the polygon trench regions by a fixed amount approaching one-half lambda and deleting polygon trench regions which shrink to a zero dimension;

expanding the boundaries of the modified polygon trench regions by a fixed amount approaching lambda and deleting polygon plateau regions which shrink to a zero dimension;

shrinking the boundary of the previously modified polygon trench regions by a fixed amount approaching one-half lambda to define the pattern for a first fabrication mask; and defining the pattern for a second fabrication mask in substantial correspondence to the active regions.

2. A process for creating patterns suitable for forming dielectrically filled trenches of arbitrary width between active regions in a semiconductor substrate, comprising the steps of:

defining for the semiconductor substrate an outer boundary encompassing at least one active region;

using a fixed dimension, generically identified as lambda, to define a first polygon trench region approximately lambda wide inward of the outer boundary and a second polygon trench region approximately lambda wide outward of the active region;

defining polygon plateau regions not exceeding approximately lambda in width at locations correspondingly inward and outward of the polygon trench regions, wherever the boundaries of the inward and outward polygon trench regions are separated by approximately two lambda or greater;

defining polygon trench regions not exceeding approximately lambda in width at locations correspondingly inward and outward of the polygon plateau regions, wherever the boundaries of the inward and outward polygon plateau regions are separated by approximately two lambda or greater;

repeating in succession the preceding two steps until the remaining regions are all separated by less than two lambda;

shrinking the boundaries of the polygon trench regions by a fixed amount approaching one-half lambda and deleting polygon trench regions which shrink to a zero dimension;

expanding the boundaries of the modified polygon trench regions by a fixed amount approaching lambda and deleting polygon plateau regions which shrink to a zero dimension;

shrinking the boundary of the previously modified polygon trench regions by a fixed amount approaching one-half lambda to define the pattern for a first fabrication mask;

defining the pattern for a second fabrication mask in substantial correspondence to the active regions; and wherein lambda is defined as a variable relating at the minimum value to the photolithographic precision of the etch masks and at the maximum value to the conformal deposition characteristics of the dielectric within the trenches and etched plateau regions.

3. The process recited in claim 2, wherein the sizes and locations of the trench and plateau regions in the first etch mask are defined by software which functionally replicate the steps of a common mask analysis language on a CALMA layout system, where lambda is selected to have a value "X" and the steps are:

INPUTMASK(ACTIVE,2 3,0-63)
INPUTMASK(BOUND,63,0-63)
INVERSE:=BOUND MINUS ACTIVE
INT1:=UNDERSIZE(X,INVERSE)
M0:=INVERSE MINUS INT1
INT2:=UNDERSIZE(X,INT1)
INT3:=UNDERSIZE(X,INT2)
M1:=INT2 MINUS INT3
INT4:=UNDERSIZE(X,INT3)
INT5:=UNDERSIZE(X,INT4)
M2:=INT4 MINUS INT5
INT6:=UNDERSIZE(X,INT5)
INT7:=UNDERSIZE(X,INT6)
M3:=INT6 MINUS INT7
INTn:=UNDERSIZE(X,INTn−1)
INTn+1:-UNDERSIZE(X,INTn)
Mi:=INTn MINUS INTn+1
O0:=M0 OR M1
O1:=O0 OR M2
O2:=O1 OR M3
O3:=O2 OR M4
Oi:=Oi−1 OR Mi+1
TEMPA:=UNDERSIZE (0.49X,Oi)
TEMPA2:=OVERSIZE (0.98X,010)
MASKA:=UNDERSIZE (0.49X,011)
MASKA2:=ACTIVE OR MASKA
OUTPUTMASK(MASKA2,3 0).

* * * * *